(12) United States Patent
Tekumalla et al.

(10) Patent No.: US 8,812,921 B2
(45) Date of Patent: Aug. 19, 2014

(54) DYNAMIC CLOCK DOMAIN BYPASS FOR SCAN CHAINS

(75) Inventors: Ramesh C. Tekumalla, Breinigsville, PA (US); Priyesh Kumar, Pune (IN)

(73) Assignee: LSI Corporation, San Jose, CA (US)

( * ) Notice: Subject to any disclaimer, the term of this patent is extended or adjusted under 35 U.S.C. 154(b) by 0 days.

(21) Appl. No.: 13/280,797

(22) Filed: Oct. 25, 2011

(65) Prior Publication Data
US 2013/0103994 A1    Apr. 25, 2013

(51) Int. Cl.
*G01R 31/28*    (2006.01)
*G01R 31/3185*    (2006.01)

(52) U.S. Cl.
CPC *G01R 31/318558* (2013.01); *G01R 31/318594* (2013.01)
USPC .................................................. 714/726

(58) Field of Classification Search
None
See application file for complete search history.

(56) References Cited

U.S. PATENT DOCUMENTS

| | | | |
|---|---|---|---|
| 5,390,190 A | 2/1995 | Nanda et al. | |
| 5,477,545 A * | 12/1995 | Huang | 714/727 |
| 5,909,451 A | 6/1999 | Lach et al. | |
| 6,243,665 B1 * | 6/2001 | Nagoya et al. | 703/20 |
| 7,129,762 B1 * | 10/2006 | Vadi | 327/218 |
| 7,373,568 B1 * | 5/2008 | Horovitz | 714/726 |
| 7,613,967 B1 | 11/2009 | Tan | |
| 7,831,876 B2 * | 11/2010 | Goyal et al. | 714/729 |
| 2004/0098687 A1 | 5/2004 | Guettaf et al. | |
| 2005/0055615 A1 * | 3/2005 | Agashe et al. | 714/727 |
| 2005/0262409 A1 * | 11/2005 | Wang et al. | 714/738 |
| 2006/0129900 A1 * | 6/2006 | Clark | 714/726 |
| 2007/0186132 A1 | 8/2007 | Dingemanse | |
| 2007/0245180 A1 | 10/2007 | Li | |
| 2008/0126898 A1 | 5/2008 | Pandey | |
| 2008/0133989 A1 * | 6/2008 | Hayashi et al. | 714/726 |
| 2008/0288842 A1 * | 11/2008 | Waayers et al. | 714/729 |

(Continued)

FOREIGN PATENT DOCUMENTS

| | | |
|---|---|---|
| EP | 1826579 A1 | 8/2007 |
| EP | 12188947 | 2/2013 |
| JP | 2008275480 A | 11/2008 |

OTHER PUBLICATIONS

I. Bayraktaroglu et al., "Test Volume and Application Time Reduction Through Scan Chain Concealment," Design Automation Conference, Jun. 2001, pp. 151-155.

(Continued)

*Primary Examiner* — Ajay Bhatia
*Assistant Examiner* — Thien D Nguyen
(74) *Attorney, Agent, or Firm* — Ryan, Mason & Lewis, LLP

(57) ABSTRACT

An integrated circuit comprises scan test circuitry and additional circuitry subject to testing utilizing the scan test circuitry. The scan test circuitry comprises at least one scan chain having a plurality of sub-chains associated with respective distinct clock domains, and clock domain bypass circuitry configured to selectively bypass one or more of the sub-chains. The scan chain is configurable in a scan shift mode of operation to form a serial shift register that includes fewer than all of the sub-chains with at least a remaining one of the sub-chains being bypassed by the clock domain bypass circuitry so as to not be part of the serial shift register in the scan shift mode. By selectively bypassing portions of the scan chain associated with particular clock domains, the clock domain bypass circuitry serves to reduce test time and power consumption during scan testing.

18 Claims, 5 Drawing Sheets

(56) References Cited

U.S. PATENT DOCUMENTS

| | | | |
|---|---|---|---|
| 2010/0031101 A1* | 2/2010 | Kapur et al. | 714/726 |
| 2010/0188096 A1 | 7/2010 | Waayers et al. | |
| 2012/0166860 A1* | 6/2012 | Khullar et al. | 713/501 |

OTHER PUBLICATIONS

Y. Bonhomme et al., "An Efficient Scan Tree Design for Test Time Reduction," Ninth IEEE European Test Symposium (ETS), May 2004, pp. 174-179.

Y. Cho et al., "On Reducing Test Application Time for Scan Circuits Using Limited Scan Operations and Transfer Sequences," IEEE Transactions on Computer-Aided Design of Integrated Circuits and Systems, Oct. 2005, pp. 1594-1605, vol. 24, No. 10.

O. Sinanoglu, "Construction of an Adaptive Scan Network for Test Time and Data Volume Reduction," Computers & Digital Techniques, Jan. 2008, pp. 12-22, vol. 2, No. 1.

P. Shanmugasundaram et al., "Dynamic Scan Clock Control for Test Time Reduction Maintaining Peak Power Limit," 29th IEEE VLSI Test Symposium (VTS), May 2011, pp. 248-253.

Hetherington et al., "Logic BIST for Large Industrial Designs; Real Issues and Case Studies," Proceedings of International Test Conference, Sep. 1999, pp. 358-367, New York, NY.

\* cited by examiner

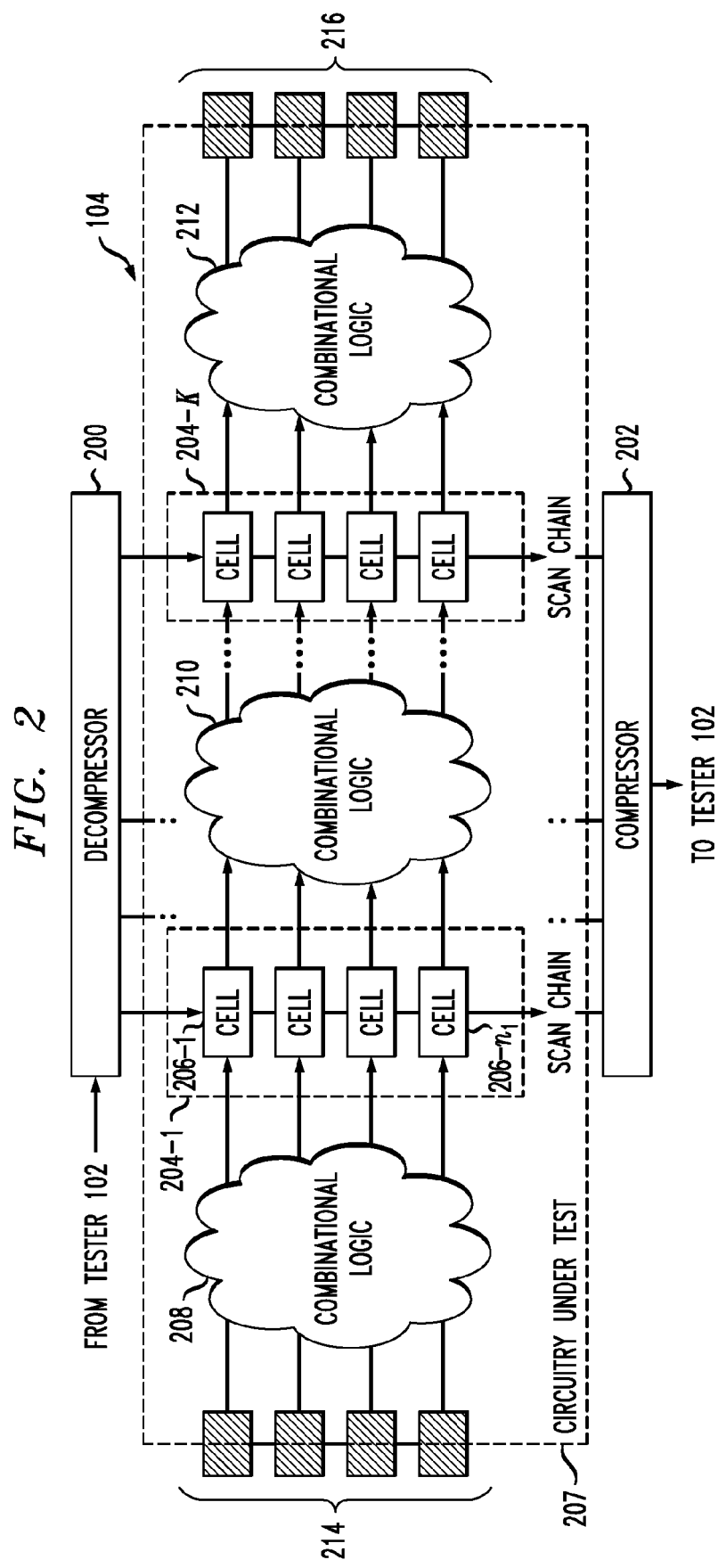

DYNAMIC CLOCK DOMAIN BYPASS FOR SCAN CHAINS

BACKGROUND

Integrated circuits are often designed to incorporate scan test circuitry that facilitates testing for various internal fault conditions. Such scan test circuitry typically comprises scan chains, which are chains of flip-flops that are used to form serial shift registers for applying test patterns at inputs to combinational logic of the integrated circuit and for reading out the corresponding results. A given one of the flip-flops of the scan chain may be viewed as an example of what is more generally referred to herein as a "scan cell."

In one exemplary arrangement, an integrated circuit with scan test circuitry may have a scan shift mode of operation and a functional mode of operation. A flag may be used to indicate whether the integrated circuit is in scan shift mode or functional mode. In the scan shift mode, the flip-flops of the scan chain are configured as a serial shift register. A test pattern is then shifted into the serial shift register formed by the flip-flops of the scan chain. Once the desired test pattern has been shifted in, the scan shift mode is disabled and the integrated circuit is placed in its functional mode. Internal combinational logic results occurring during this functional mode of operation are then captured by the chain of scan flip-flops. The integrated circuit is then once again placed in its scan shift mode of operation, in order to allow the captured combinational logic results to be shifted out of the serial shift register formed by the scan flip-flops, as a new test pattern is being scanned in. This process is repeated until all desired test patterns have been applied to the integrated circuit.

As integrated circuits have become increasingly complex, scan compression techniques have been developed which reduce the number of test patterns that need to be applied when testing a given integrated circuit, and therefore also reduce the required test time. However, the use of high levels of scan compression can adversely impact diagnostic resolution, that is, the ability to attribute a particular failure to an exact fault or set of faults within the combinational logic. As a result, when using scan compression, a tradeoff exists between compression level and diagnostic resolution. Additional details regarding compressed scan testing are disclosed in U.S. Pat. No. 7,831,876, entitled "Testing a Circuit with Compressed Scan Subsets," which is commonly assigned herewith and incorporated by reference herein.

Nonetheless, in both compressed and noncompressed scan testing, there remains a need for further reductions in test time, as well as improvements in other scan testing performance parameters, such as integrated circuit power consumption during scan testing.

SUMMARY

Illustrative embodiments of the invention provide a substantial improvement in scan testing by selectively bypassing portions of a scan chain that are associated with clock domains that are not active for a given test pattern. By selectively bypassing portions of the scan chain associated with particular clock domains, both test time and power consumption during scan testing can be reduced.

In one embodiment of the invention, an integrated circuit comprises scan test circuitry and additional circuitry subject to testing utilizing the scan test circuitry. The scan test circuitry comprises at least one scan chain having a plurality of sub-chains associated with respective distinct clock domains, and clock domain bypass circuitry configured to selectively bypass one or more of the sub-chains. The scan chain is configurable in a scan shift mode of operation to form a serial shift register that includes fewer than all of the sub-chains with at least a remaining one of the sub-chains being bypassed by the clock domain bypass circuitry so as to not be part of the serial shift register in the scan shift mode. More particularly, the clock domain bypass circuitry may be configured to bypass one or more of the sub-chains that are determined to be inactive in a capture phase of a particular test pattern, such that the clock domain bypass circuitry bypasses different ones of the sub-chains for different test patterns.

In one or more of the illustrative embodiments, the clock domain bypass circuitry comprises a plurality of clock domain bypass multiplexers and a plurality of clock domain bypass registers, with the clock domain bypass registers storing respective control values for application to respective select lines of the clock domain bypass multiplexers. Each of the sub-chains may be associated with one of the clock domain bypass multiplexers and one of the clock domain bypass registers.

A given one of the clock domain bypass multiplexers may have at least a first input coupled to an input of a corresponding one of the sub-chains and a second input coupled to an output of the corresponding one of the sub-chains, with the given clock domain bypass multiplexer being configured to selectively bypass its corresponding sub-chain responsive to the control value stored in its associated clock domain bypass register.

The scan test circuitry in one or more of the illustrative embodiments may further comprise a decompressor, a compressor, and a plurality of scan chains including the above-mentioned scan chain arranged in parallel with one another between respective outputs of the decompressor and respective inputs of the compressor. Scan test signals are applied to respective inputs of the decompressor. Scan test input data from the decompressor based on the scan test signals is shifted into the scan chains for use in the scan testing, and scan test output data indicative of results of the scan testing is subsequently shifted out of the scan chains into the compressor.

Scan test circuitry comprising clock domain bypass circuitry of the type described above can be configured in one or more of the illustrative embodiments to bypass those sub-chains that are inactive for a given test pattern, thereby reducing the number of clock cycles required to shift data into and out of the corresponding scan chain, which results in reductions in test time as well as power consumption during scan testing. These improvements are provided without any significant negative impact on integrated circuit area requirements or functional timing requirements. Test patterns can be generated in a manner that takes the operation of the clock domain bypass circuitry into account, and expected scan test responses determined accordingly, in an otherwise conventional test generation tool.

BRIEF DESCRIPTION OF THE DRAWINGS

FIG. 1 is a block diagram showing an integrated circuit testing system comprising a tester and an integrated circuit under test in an illustrative embodiment.

FIG. 2 illustrates one example of the manner in which scan chains of scan test circuitry may be arranged between combinational logic in the integrated circuit of FIG. 1.

DETAILED DESCRIPTION

Figure 3:
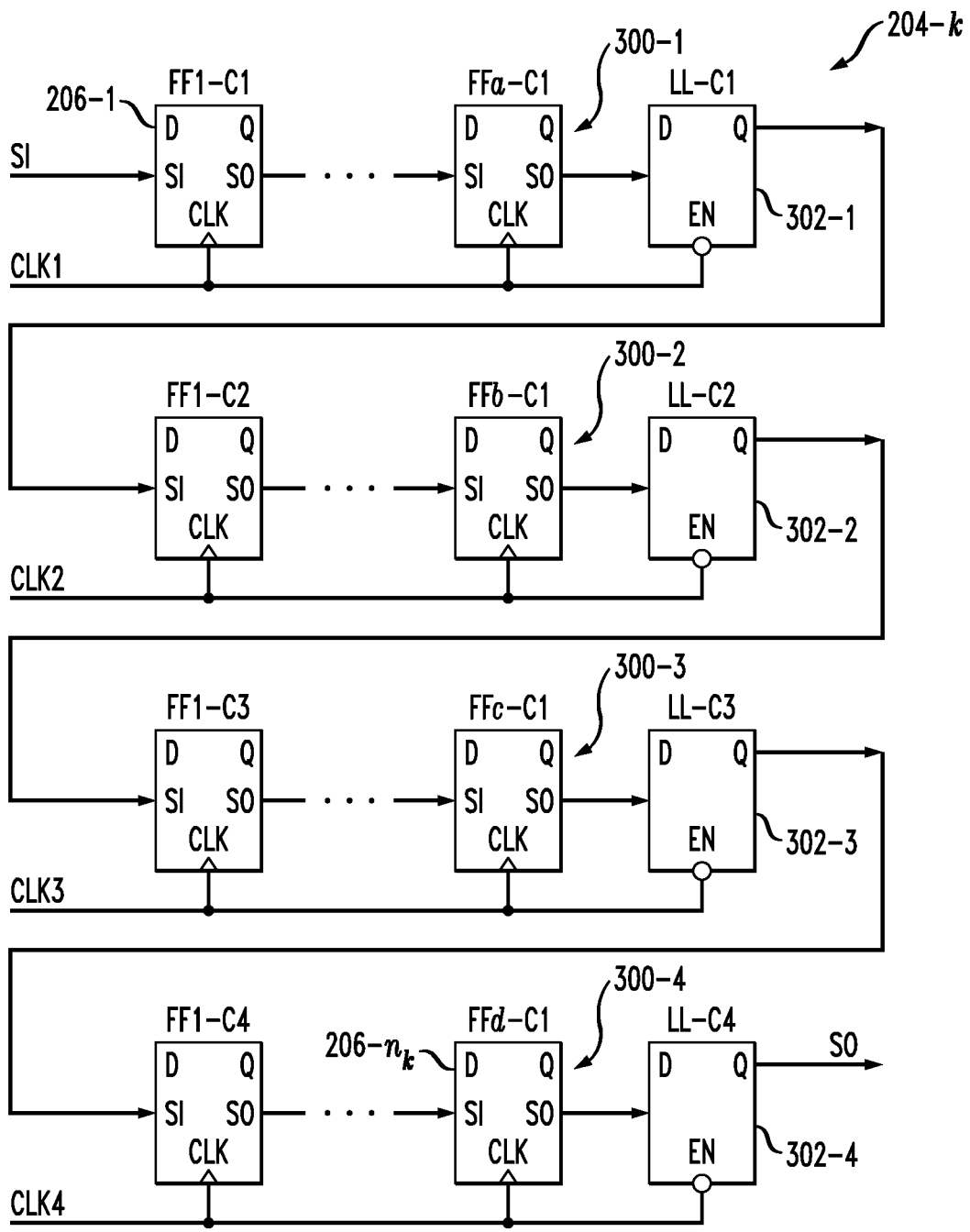
FIG. 3 is a view of a multiple clock domain scan chain of the scan test circuitry of FIG. 2 with its associated clock domain bypass circuitry being omitted from the view.

Embodiments of the invention will be illustrated herein in conjunction with exemplary testing systems and corresponding integrated circuits comprising scan test circuitry for supporting scan testing of additional circuitry of those integrated circuits. It should be understood, however, that embodiments of the invention are more generally applicable to any testing system or associated integrated circuit in which it is desirable to provide reduced test time and/or lower power consumption during scan testing by selectively bypassing portions of a scan chain.

FIG. 1 shows an embodiment of the invention in which a testing system 100 comprises a tester 102 and an integrated circuit under test 104. The integrated circuit 104 comprises scan test circuitry 106 that is coupled to additional internal circuitry 108 that is subject to testing utilizing the scan test circuitry 106. The tester 102 stores scan data 110 associated with scan testing of the integrated circuit. Such scan data may correspond to test patterns provided by a test pattern generator 112. In other embodiments, at least a portion of the tester 102, such as the test pattern generator 112, may be incorporated into the integrated circuit 104. Alternatively, the entire tester 102 may be incorporated into the integrated circuit 104.

The particular configuration of testing system 100 as shown in FIG. 1 is exemplary only, and the testing system 100 in other embodiments may include other elements in addition to or in place of those specifically shown, including one or more elements of a type commonly found in a conventional implementation of such a system. For example, various elements of the tester 102 or other parts of the system 100 may be implemented, by way of illustration only and without limitation, utilizing a microprocessor, central processing unit (CPU), digital signal processor (DSP), application-specific integrated circuit (ASIC), field-programmable gate array (FPGA), or other type of data processing device, as well as portions or combinations of these and other devices.

Embodiments of the invention may be configured to utilize compressed or noncompressed scan testing, and the invention is not limited in this regard. However, the illustrative embodiment shown in FIG. 2 will be described primarily in the context of compressed scan testing.

Referring now to FIG. 2, portions of one potential configuration of the integrated circuit 104 are shown in greater detail. In this compressed scan testing arrangement, the scan test circuitry 106 comprises a decompressor 200, a compressor 202, and a plurality of scan chains 204-$k$, where $k=1, 2, \ldots K$. Each of the scan chains 204 comprises a plurality of scan cells 206, and is configurable to operate as a serial shift register in a scan shift mode of operation of the integrated circuit 104 and to capture functional data from circuitry under test 207 in a functional mode of operation of the integrated circuit 104. It will be assumed that at least one of the scan chains 204 is a multiple clock domain scan chain, that is, a scan chain comprising sub-chains associated with respective distinct clock domains.

The scan chains 204 are generally arranged in parallel with one another between respective outputs of the decompressor 200 and respective inputs of the compressor 202, such that in the scan shift mode of operation, scan test input data from the decompressor 200 is shifted into the scan chains 204 and scan test output data is shifted out of the scan chains 204 into the compressor 202.

The first scan chain 204-1 is of length $n_1$ and therefore comprises $n_1$ scan cells denoted 206-1 through 206-$n_1$. More generally, scan chain 204-$k$ is of length $n_k$ and therefore comprises a total of $n_k$ scan cells.

In embodiments of the invention, the lengths of the scan chains 204 are balanced so that the same amount of time is needed to shift the desired set of scan test patterns into all of the scan chains. It may therefore be assumed without limitation that all of the scan chains 204 are of length n, such that $n_1=n_2=\ldots=n_k=n$.

Circuitry under test 207 in this embodiment comprises a plurality of combinational logic blocks, of which exemplary blocks 208, 210 and 212 are shown. The combinational logic blocks are illustratively arranged between primary inputs 214 and primary outputs 216 and separated from one another by the scan chains 204.

Combinational logic blocks such as 208, 210 and 212 may be viewed as examples of what are more generally referred to herein as "additional circuitry" that is subject to testing utilizing scan test circuitry in embodiments of the invention. By way of example, such internal circuitry blocks of integrated circuit 104 may represent portions of different integrated circuit cores, such as respective read channel and additional cores of a system-on-chip (SOC) integrated circuit in a hard disk drive (HDD) controller application, designed for reading and writing data from one or more magnetic storage disks of an HDD. In other embodiments, the circuit blocks subject to testing by the scan chains may comprise other types of functional logic circuitry, in any combination, and the term "additional circuitry" is intended to be broadly construed so as to cover any such arrangements of logic circuitry.

The decompressor 200 of the scan test circuitry 106 receives compressed scan data from the tester 102 and decompresses that scan data to generate scan test input data that is shifted into the scan chains 204 when such chains are configured as respective serial shift registers in the scan shift mode of operation. The compressor 202 of the scan test circuitry 106 receives scan test output data shifted out of the scan chains 204, also when such chains are configured as respective serial shift registers in the scan shift mode of operation, and compresses that scan test output data for delivery back to the tester 102.

Compressed scan input data is applied by tester 102 to N scan inputs of decompressor 200, and compressed scan output data is provided from compressor 202 back to tester 102 via N scan outputs. As noted previously, the K scan chains 204 are arranged in parallel between respective outputs of the decompressor 200 and respective inputs of the compressor 202 as shown. Each of the individual scan chains 204 is configurable to operate as a serial shift register in the scan shift mode of operation of the integrated circuit 104 and also to capture functional data from combinational logic elements in the functional mode of operation of the integrated circuit 104.

The number K of scan chains 204 is generally much larger than the number N of scan test outputs of the compressor 202. The ratio of K to N provides a measure of the degree of scan test pattern compression provided in the scan test circuitry 106. It should be noted, however, that the number of compressor outputs need not be the same as the number of decompressor inputs. For example, there may be N decompressor inputs and L compressor outputs, where N≠L but both N and L are much smaller than K.

The scan inputs of the decompressor 200 may be viewed as corresponding to respective ones of what are more generally referred to herein as "scan channels" of the integrated circuit 104.

Additional details regarding the operation of scan compression elements such as decompressor 200 and compressor 202 may be found in the above-cited U.S. Pat. No. 7,831,876. Again, scan compression elements such as decompressor 200 and compressor 202 may not be present in other embodiments of the invention. In an embodiment of the invention without scan compression, where the decompressor 200 and compressor 202 are eliminated, the scan channels may simply correspond to respective ones of the scan chains 204.

A given test pattern applied to the scan chains 204 in the present embodiment may be viewed as a scan vector, where a scan vector comprises a shift-in phase in which scan test input data is shifted into all of the scan chains 204, followed by a capture phase in which functional data is captured, followed by a shift-out phase in which scan test output data is shifted out from all of the scan chains 204. The scan vectors for different test patterns may overlap with one another, in that as input data is shifted in for a given test pattern, captured data for a previous pattern may be shifted out. The shift-in and shift-out phases may be individually or collectively referred to herein as one or more scan shift phases of the scan vector or associated test pattern.

As indicated previously, important issues in integrated circuit scan testing include test time and power consumption. The scan test circuitry 106 in the present embodiment addresses these issues by dynamically bypassing particular sub-chains of one or more of the scan chains 204. This functionality is implemented by clock domain bypass circuitry incorporated into the scan test circuitry, as will be described in greater detail in conjunction with FIGS. 3, 4 and 5 below.

FIG. 3 shows a particular scan chain 204-$k$ of the scan test circuitry 106 in greater detail. The scan chain as shown is an example of what is more generally referred to herein as a multiple clock domain scan chain, that is, a scan chain that includes a plurality of sub-chains associated with respective distinct clock domains of the integrated circuit 104. It is assumed that this scan chain 204-$k$ has clock domain bypass circuitry associated therewith, but that circuitry is not shown in this particular figure.

Each of the sub-chains 300 in this embodiment of the invention includes two or more scan cells 206. More particularly, the scan chain 204-$k$ comprises scan cells 206-1 through 206-$n_k$, grouped into four sub-chains 300-1, 300-2, 300-3 and 300-4 associated with respective clock signals CLK1, CLK2, CLK3 and CLK4. In this embodiment, each of the clock signals CLK1, CLK2, CLK3 and CLK4 is assumed to be associated with a different clock domain of the integrated circuit 104. It is to be appreciated, however, that the term "clock domain" as used herein is intended to be broadly construed, and accordingly should not be viewed as requiring or foreclosing any particular relationship among the clock signals.

Each of the scan cells 206 in the present embodiment has a data input (D), a data output (Q), a scan input (SI), a scan output (SO) and a clock input (CLK), and may include additional or alternative inputs and outputs that are not explicitly shown. The two or more scan cells 206 of each of the sub-chains 300 are clocked by the corresponding clock signal CLK1, CLK2, CLK3 or CLK4 associated with that sub-chain.

The sub-chain 300-1 includes scan cells 206 that are more particularly denoted FF1-C1 through FFa-C1, where a is a variable specifying the total number of scan cells in that sub-chain. Similarly, the sub-chain 300-2 includes scan cells 206 that are more particularly denoted FF1-C2 through FFb-C2, the sub-chain 300-3 includes scan cells 206 that are more particularly denoted FF1-C3 through FFc-C3, and the sub-chain 300-4 includes scan cells 206 that are more particularly denoted FF1-C4 through FFd-C4, where b, c and d are variables specifying the total numbers of scan cells in the respective sub-chains. In the present embodiment, each of a, b, c and d is assumed to be greater than or equal to two. The sub-chains 300 may each have different numbers of scan cells 206, or two or more of the sub-chains may have the same number of scan cells.

The sub-chains 300-1, 300-2, 300-3 and 300-4 in this embodiment are separated from one another by respective lockup latches 302-1, 302-2, 302-3 and 302-4. Each of these lockup latches is implemented as a D-type flip-flop having an enable input (EN) that is clocked by the corresponding clock signal CLK1, CLK2, CLK3 or CLK4. The lockup latches associated with the sub-chains 300-1, 300-2, 300-3 and 300-4 are more particularly denoted as LL-C1, LL-C2, LL-C3 and LL-C4, respectively.

In a scan shift mode of operation, the scan chain 204-$k$ is configurable to form a serial shift register that includes fewer than all of the sub-chains 300. Thus, one or more of the sub-chains 300 may be selectively bypassed by the above-noted clock domain bypass circuitry so as to not be part of the serial shift register formed by the scan chain 204-$k$ in the scan shift mode. More particularly, the clock domain bypass circuitry is configured to bypass one or more of the sub-chains 300 that are determined to be inactive for a particular test pattern, such that the clock domain bypass circuitry may bypass different ones of the sub-chains 300 for different test patterns.

The clock domain bypass functionality of the present embodiment is based at least in part on our recognition that not all of the clock domains are used for every applied test pattern. For example, assume in the FIG. 3 arrangement that each of the sub-chains includes only two scan cells, such that the entire scan chain includes at most 8 scan cells. It would therefore require 8 clock cycles to shift the contents of the entire scan chain in or out. If one particular clock domain is not used in an associated functional data capture phase of a given test pattern, we can reduce the scan shift time by two clock cycles, resulting in a scan shift time savings of 25% for the given test pattern, if we bypass that inactive clock domain in such a way that the scan data is not shifted through the corresponding sub-chain.

Accordingly, significant reductions in scan test times are achievable by identifying clock domains that are idle or inactive for each test pattern to be applied, and bypassing those inactive clock domains when the corresponding test pattern is applied. Since the clock domains of the bypassed sub-chains are inactive, there is no need to shift out the contents of the scan cells in those sub-chains as no faults will be detected by those scan cells. In other words, for any clock domain that is not pulsed in the capture phase of a given test pattern, there is no need to shift the contents out of the corresponding scan cells since there are no faults propagated to those scan cells. Therefore, in the present embodiment we shift out for a given test pattern only those particular sub-chains for which the corresponding clock domains were active in the capture phase of that test pattern.

Figure 4:
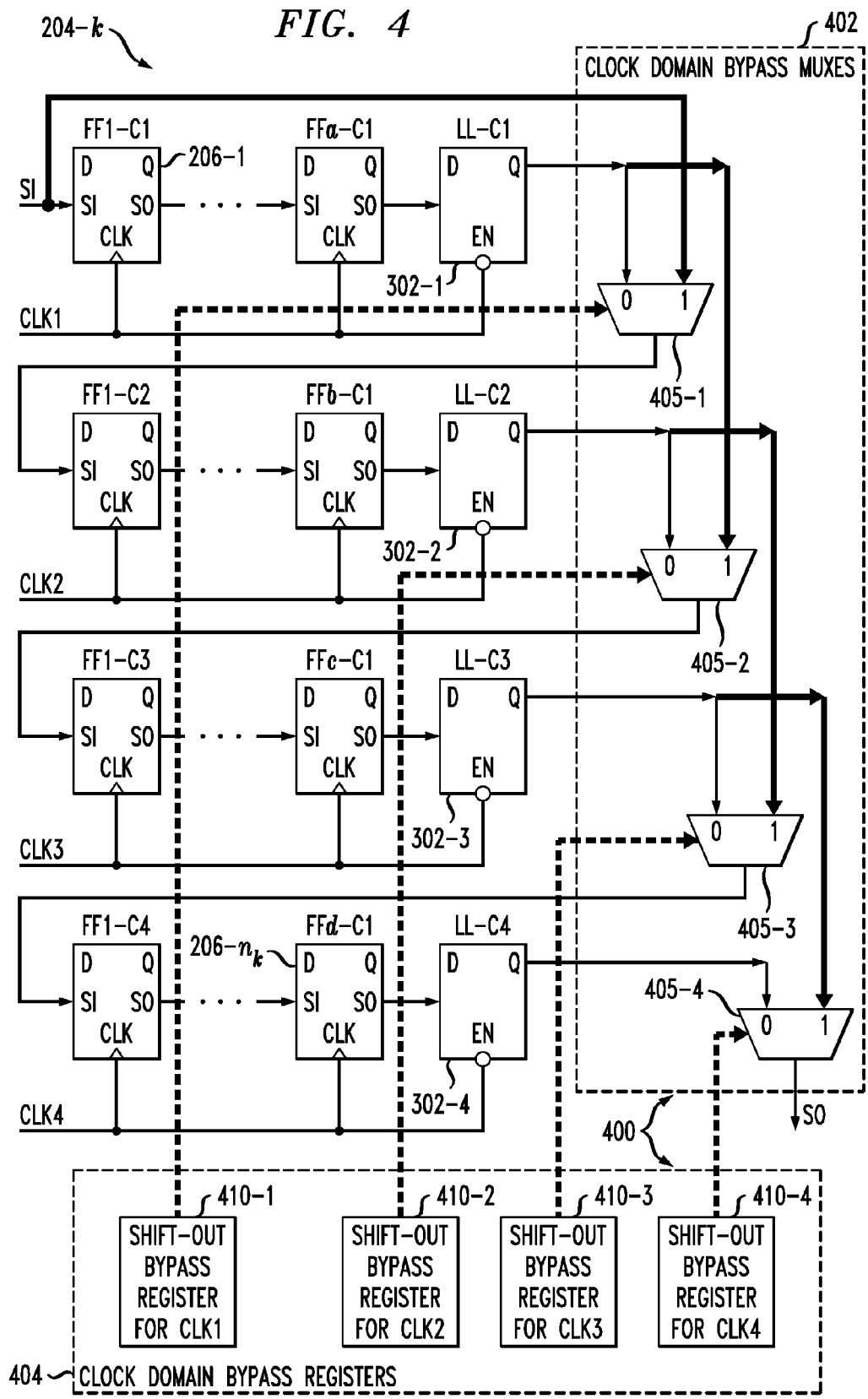
FIG. 4 is another view of the multiple clock domain scan chain of FIG. 3 showing the associated clock domain bypass circuitry.

FIG. 4 shows scan chain 204-k of FIG. 3 with its associated clock domain bypass circuitry 400. The clock domain bypass circuitry 400 is configured to selectively bypass one or more of the sub-chains 300 as previously described, such that the scan chain 204-k in the scan shift mode of operation forms a serial shift register that includes fewer than all of the sub-chains 300. The clock domain bypass circuitry 400 in the present embodiment comprises a plurality of clock domain bypass multiplexers 402 and a plurality of clock domain bypass registers 404.

The clock domain bypass multiplexers 402 in the present embodiment more particularly comprise two-to-one multiplexers 405-1, 405-2, 405-3 and 405-4 associated with respective ones of the sub-chains 300-1, 300-2, 300-3 and 300-4. The multiplexers 405 are arranged in the scan path scan chain 204-k between the CLK1, CLK2, CLK3 and CLK4 clock domains as shown in the figure, with each such multiplexer 405 immediately following the lockup latch 302 of the corresponding clock domain.

The clock domain bypass registers 404 in the present embodiment more particularly comprise shift-out bypass registers 410-1, 410-2, 410-3 and 410-4 associated with respective ones of the sub-chains 300-1, 300-2, 300-3 and 300-4. The clock domain bypass registers 404 store respective control values for application to respective select lines of the clock domain bypass multiplexers 402, with those stored values controlling whether or not the corresponding clock domains CLK1, CLK2, CLK3 and CLK4 are bypassed for a given test pattern.

A given one of the clock domain bypass multiplexers 405 has a first input coupled to an input of a corresponding one of the sub-chains 300 and a second input coupled to an output of the corresponding one of the sub-chains 300. The given clock domain bypass multiplexer is configured to selectively bypass its corresponding sub-chain 300 responsive to the control value stored in its associated clock domain bypass register 410. In this embodiment, a logic "1" value stored in the register 410 indicates that the corresponding sub-chain will be bypassed in the scan shift mode, and a logic "0" value stored in the register 410 indicates that the corresponding sub-chain will not be bypassed in the scan shift mode. Thus, for example, if register 410-2 stores a logic "1" value and the other registers store logic "0" values, the sub-chain 300-2 is bypassed, and the serial shift register formed by the scan chain 204-k will include sub-chains 300-1, 300-3 and 300-4.

Figure 5:
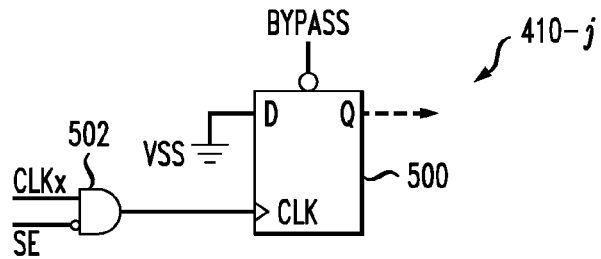
FIG. 5 shows one possible implementation of a clock domain bypass register of the clock domain bypass circuitry of FIG. 4.

As shown in FIG. 5, a given one of the clock domain bypass registers 410-j, where j=1, 2, 3 or 4 in the present embodiment, comprises a settable D-type flip-flop 500 and a logic gate 502. The flip-flop 500 has a data input denoted D and coupled to a voltage potential, illustratively VSS or ground, a data output denoted Q and coupled to the select line of a corresponding one of the clock domain bypass multiplexers 405, a set input coupled to a bypass signal line, and a clock input denoted CLK and driven as a function of a clock signal CLKx of the associated clock domain and a scan enable (SE) signal.

The SE signal is driven to a first logic level, which for illustrative purposes in this embodiment of the invention will be assumed to be a logic "1" level, to place the integrated circuit 104 in the scan shift mode of operation, and is driven to a second logic level, which for illustrative purposes in this embodiment of the invention will be assumed to be a logic "0" level, to place the integrated circuit 104 in the functional mode of operation, although other types and combinations of operating modes and scan enable signaling may be used in other embodiments of the invention. For example, different portions of the integrated circuit 104 and its associated scan test circuitry 106 may be controlled using separate scan enable signals.

The logic gate 502 is operative to generate a signal for application to the clock signal input of the flip-flop 500 as a function of the clock signal CLKx of the associated clock domain and the SE signal. The logic gate in the present embodiment more particularly comprises an AND gate having a non-inverting input adapted to receive the clock signal CLKx of the associated clock domain, and an inverting input adapted to receive the SE signal, such that the signal generated by the AND gate 502 for application to the clock input of the flip-flop 500 corresponds to the clock signal CLKx of the associated clock domain gated by an inverted version of the SE signal.

Thus, when the SE signal is at a logic "1" level, corresponding to the scan shift mode of operation, the inverted version of the SE signal is at a logic "0" level, such that CLKx is prevented by AND gate 502 from being applied to the CLK input of the flip-flop 500. Accordingly, the flip-flop 500 can only be reset to store the logic "0" value that is always present at its D input in the FIG. 5 embodiment when the scan enable signal is at a logic "0" level, which occurs in the capture phase of the test pattern.

This arrangement therefore turns off the clock signal applied to the flip-flop 500 when the SE signal is at a logic "1" level. A downward transition on the bypass signal line sets the stored value in the flip-flop back to a logic "1" value. Thus, when the bypass signal transitions from a logic "1" level to a logic "0" level, the Q output of the flip-flop transitions from a logic "0" level to a logic "1" level.

The bypass signal transitions from a logic "1" level to a logic "0" level immediately after the scan shift phase is complete, which may be at the beginning of the associated capture phase, and then returns to the logic "1" level for the remainder of the capture phase. During the capture phase, the SE signal is at a logic "0" level, such that if a transition occurs during capture in the CLKx signal, that transition is propagated through gate 502 to the CLK input of the flip-flop 500, causing the Q output to transition to from a logic "1" level to a logic "0" level.

Figure 6:
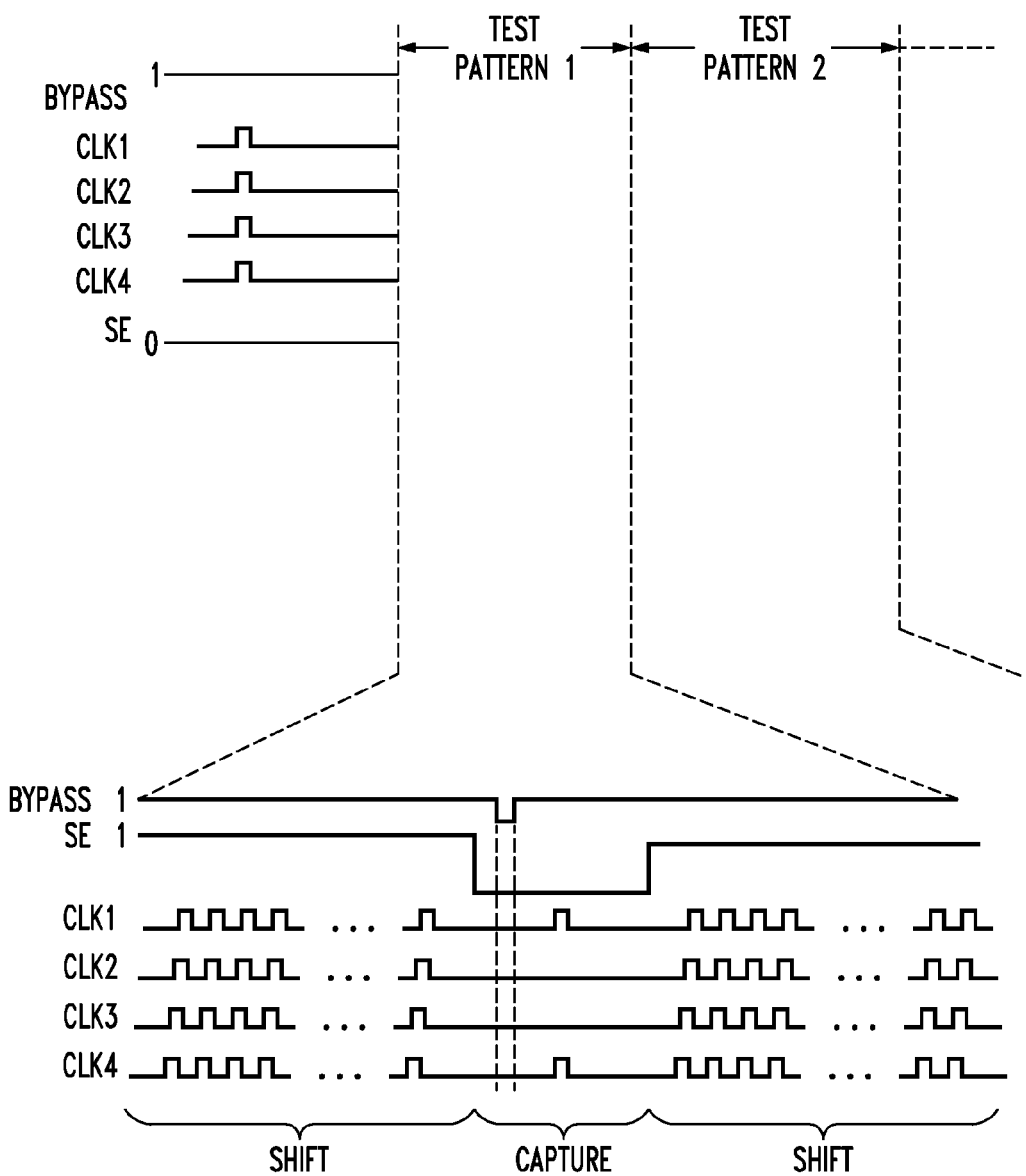
FIG. 6 is a timing diagram illustrating the operation of the clock domain bypass circuitry of FIGS. 4 and 5.

FIG. 6 illustrates the operation of the clock domain bypass circuitry of FIGS. 4 and 5. This timing diagram shows example waveforms for the bypass and SE signals and the clock signals CLK1, CLK2, CLK3 and CLK4 over two test patterns. As noted previously, the shift-out phase of the first test pattern, denoted Test Pattern 1, overlaps with the shift-in phase of the second test pattern, denoted Test Pattern 2. These phases are more generally referred to as shift phases in the context of the FIG. 6 timing diagram.

Before the first test pattern is applied, the bypass signal is set to a logic "1" level, the SE signal is set to a logic "0" level, and the CLKx signals are each pulsed once in order to set the Q outputs of the bypass shift register flip-flops 500 to logic "0" levels. When the test enters the shift phase, the SE signal is set to a logic "1" level so as to shut off the clock signals via the AND gates 502 such that the Q outputs of the flip-flops 500 remain at the logic "0" level. When the shift phase is completed, the capture phase begins.

The bypass signal is pulsed to the logic "0" level once at the beginning of the capture phase, which causes the Q outputs of the flip-flops 500 to move to the logic "1" level. If CLKx subsequently makes at least one transition during the capture phase, the Q output of the corresponding flip-flop 500 will return to the logic "0" level, meaning that the corresponding clock domain should not be bypassed. For the inactive clock domains in which there is no transition in the corresponding clock signal during the capture phase, the Q output of the flip-flop 500 in the associated bypass register will remain at the logic "1" level. In the FIG. 6 example, there are clock pulses for the CLK1 and CLK4 clock signals during the capture phase, meaning that the CLK1 and CLK4 clock domains are active in this capture phase, while the CLK2 and CLK3 clock domains are inactive in this capture phase. The particular clock domains that are active will generally change from capture phase to capture phase depending upon the corresponding applied test pattern.

After the capture phase for Test Pattern 1 is completed, this process repeats for each additional test pattern, starting with Test Pattern 2.

Accordingly, a logic "1" value for designating bypass of one of the sub-chains 300-$j$ is stored in the corresponding clock domain bypass register 410-$j$ responsive to assertion of the bypass signal line, which occurs once during the capture phase of each applied test pattern. This is also referred to as setting the flip-flop 500, and the bypass signal is active low in the present embodiment. Furthermore, the register 410-$j$ is reset in conjunction with application of each of a plurality of different test patterns to the scan chain. This occurs when the SE signal is at a logic "0" level, and thus outside of the scan shift mode, as previously indicated. More particularly, each of the clock domain bypass registers 410 is reset following the end of the scan shift phase for each test pattern.

The clock domain bypass circuitry 400 as illustrated in FIG. 4 can bypass one or more of the sub-chains 300 in their entirety and thereby reduce the required scan shift time by a number of clock cycles that is given by the total length in scan cells of the bypassed sub-chains. It should be noted that, when a particular clock domain is bypassed, the contents of the scan cells in that domain are retained and may be used in the next test pattern. Thus, if a particular clock domain was inactive for the capture phase of a given test pattern, the clock signal for this particular clock domain should be turned off for the scan shift phase of the next test pattern so that the scan cells retain their contents.

As noted above, the clock domain bypass registers 410 have their respective stored values set to logic "1" values after the completion of the scan shift phase of every test pattern. It should be noted that one or more extra clock cycles may be added after the actual scan shift phase ends for a given test pattern, so as to facilitate determination of which clock domains should not be shifted out for the next test pattern. For example, one or more extra cycles may be introduced between the end of the scan shift phase and the start of the capture phase, and such cycles may be used to assert the set inputs of the flip-flops 500 in the respective bypass registers 410 so as to store "1" values in all of the registers 410 while the scan shift clocks are turned off. Then, during the capture phase, selected ones of the bypass registers associated with active clock domains can be reset to logic "0" values such that the remaining bypass registers continue to store "1" values and accordingly their inactive clock domains will be bypassed in the next scan shift phase.

In an arrangement of this type, all of the bypass registers are initially reset to store logic "0" values prior to the start of the first test pattern, then all of the bypass registers are set to store logic "1" values by a single assertion of the bypass signal at or near the beginning of the capture phase, and finally selected ones of the bypass registers corresponding to active clock domains are again reset to logic "0" values responsive to occurrence of at least one transition in the associated clock signal during the capture phase. This process repeats for each test pattern. As indicated above, during the scan shift phase of the next test pattern, the scan cells in the inactive clock domains for the previous test pattern will retain their contents. Numerous alternative signaling arrangements can be used to store control values in the bypass registers so as to provide the desired bypassing of inactive clock domains.

For each test pattern in an embodiment in which the scan chains are of equal length n, there should be at least one unused clock domain in each scan chain in order to reduce the test time for that test pattern. If there are no unused clock domains, that test pattern may be applied as is without any changes.

It is to be appreciated that the particular circuits shown in FIGS. 4 and 5 are presented by way of illustrative example only, and numerous alternative arrangements of clock domain bypass circuitry may be used to provide reductions in test time and power consumption as disclosed herein. These reductions can be achieved without any significant negative impact on integrated circuit area requirements or functional timing requirements.

Figure 7:
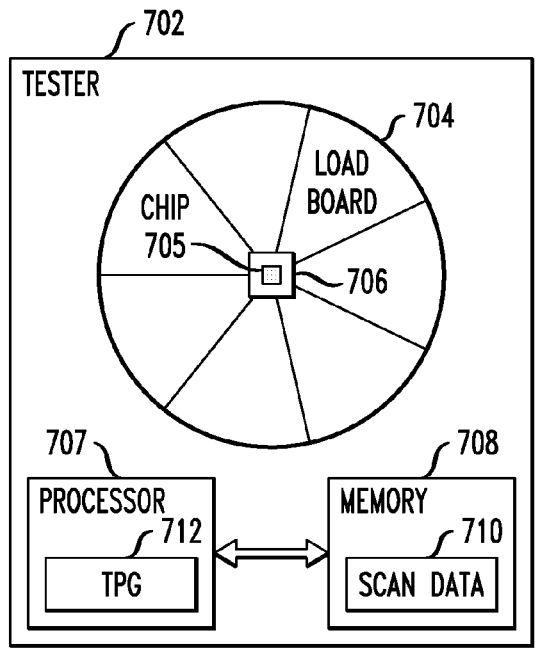
FIG. 7 shows one possible implementation of the testing system of FIG. 1.

The tester 102 in the testing system 100 of FIG. 1 need not take any particular form, and various conventional testing system arrangements can be modified in a straightforward manner to support the transition control functionality disclosed herein. One possible example is shown in FIG. 7, in which a tester 702 comprises a load board 704 in which an integrated circuit 705 to be subject to scan testing using the techniques disclosed herein is installed in a central portion 706 of the load board 704. The tester 702 also comprises processor and memory elements 707 and 708 for executing stored computer code. In the present embodiment, processor 707 is shown as implementing a test pattern generator 712. Associated scan data 710 is stored in memory 708. Numerous alternative testers may be used to perform scan testing of an integrated circuit as disclosed herein. Also, as indicated previously, in alternative embodiments portions of the tester may be incorporated into the integrated circuit itself, as in a built-in self-test (BIST) arrangement.

Figure 8:
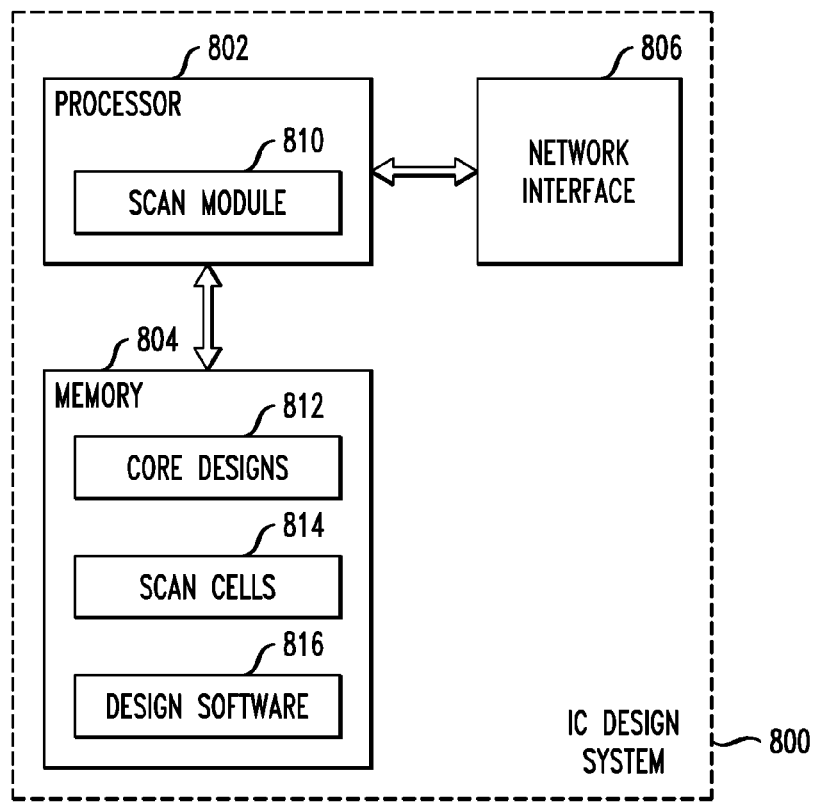
FIG. 8 is a block diagram of a processing system for generating an integrated circuit design comprising clock domain bypass circuitry of the type illustrated in FIGS. 4 and 5.

The insertion of scan cells to form scan chains, transition controllers and other scan test circuitry of an integrated circuit design may be performed in a processing system 800 of the type shown in FIG. 8. Such a processing system in this embodiment more particularly comprises a design system configured for use in designing integrated circuits such as integrated circuit 104 to include scan test circuitry 106 having clock domain bypass circuitry 400.

The system 800 comprises a processor 802 coupled to a memory 804. Also coupled to the processor 802 is a network interface 806 for permitting the processing system to communicate with other systems and devices over one or more networks. The network interface 806 may therefore comprise one or more transceivers. The processor 802 implements a scan module 810 for supplementing core designs 812 with scan cells 814 and associated clock domain bypass circuitry in the manner disclosed herein, in conjunction with utilization of integrated circuit design software 816.

By way of example, the scan chain circuitry 106 comprising scan chains 204 and associated clock domain bypass circuitry 400 may be generated in system 800 using an RTL description and then synthesized to gate level using a specified technology library. A test generation model may then be created for generating test patterns using a test generation tool. Control files may be used to provide the test generation tool with information such as the manner in which clock domains are bypassed. Once the corresponding rules are in place, a rule checker may be run so that the test generation tool has visibility of the scan chains taking into account the operation of the clock domain bypass circuitry. Test patterns may then be generated in a conventional manner.

During test pattern generation, the test generation tool has information regarding the functionality of the clock domain bypass circuitry and generates expected responses for each scan channel to take such functionality into account. Thus, the expected responses provided by the test generation tool will reflect the bypassing of one or more clock domains for a given test pattern based on whether or not those clock domains are active or inactive in a capture phase of the given test pattern.

Elements such as 810, 812, 814 and 816 are implemented at least in part in the form of software stored in memory 804 and processed by processor 802. For example, the memory 804 may store program code that is executed by the processor 802 to implement particular scan chain and transition control circuitry insertion functionality of module 810 within an overall integrated circuit design process. The memory 804 is an example of what is more generally referred to herein as a computer-readable medium or other type of computer program product having computer program code embodied therein, and may comprise, for example, electronic memory such as RAM or ROM, magnetic memory, optical memory, or other types of storage devices in any combination. The processor 802 may comprise a microprocessor, CPU, ASIC, FPGA or other type of processing device, as well as portions or combinations of such devices.

As indicated above, embodiments of the invention may be implemented in the form of integrated circuits. In a given such integrated circuit implementation, identical die are typically formed in a repeated pattern on a surface of a semiconductor wafer. Each die includes scan test circuitry as described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

Again, it should be emphasized that the embodiments of the invention as described herein are intended to be illustrative only. For example, other embodiments of the invention can be implemented using a wide variety of other types of scan test circuitry, with different types and arrangements of clock domain bypass circuitry, logic gates and other circuit elements, as well as different types and arrangements of bypass signals and test pattern phases, than those included in the embodiments described herein. These and numerous other alternative embodiments within the scope of the following claims will be readily apparent to those skilled in the art.

What is claimed is:

1. An integrated circuit comprising:
   scan test circuitry; and
   additional circuitry subject to testing utilizing the scan test circuitry;
   the scan test circuitry comprising at least one scan chain having a plurality of sub-chains associated with respective distinct clock domains, wherein the plurality of sub-chains are connected in series with each other;
   the scan test circuitry further comprising clock domain bypass circuitry configured to selectively bypass one or more of the sub-chains;
   wherein the scan chain is configurable in a scan shift mode of operation to form a serial shift register that includes fewer than all of the sub-chains with at least a remaining one of the sub-chains being bypassed by the clock domain bypass circuitry so as to not be part of the serial shift register in the scan shift mode;
   wherein the clock domain bypass circuitry is configured to bypass one or more of the sub-chains that are determined to be inactive in a capture phase of a particular test pattern; and
   wherein a given sub-chain is determined to be inactive if its corresponding clock domain remains inactive during the capture phase.

2. The integrated circuit of claim 1 wherein the clock domain bypass circuitry is configured to bypass different ones of the sub-chains for different test patterns.

3. The integrated circuit of claim 1 wherein each of the sub-chains comprises two or more scan cells.

4. The integrated circuit of claim 1 wherein the clock domain bypass circuitry comprises:
   a plurality of clock domain bypass multiplexers; and
   a plurality of clock domain bypass registers;
   wherein the clock domain bypass registers store respective control values for application to respective select lines of the clock domain bypass multiplexers.

5. The integrated circuit of claim 4 wherein each of the clock domain bypass multiplexers is associated with a corresponding one of the sub-chains.

6. The integrated circuit of claim 4 wherein each of the clock domain bypass registers is associated with a corresponding one of the sub-chains.

7. The integrated circuit of claim 4 wherein a given one of the clock domain bypass multiplexers has at least a first input coupled to an input of a corresponding one of the sub-chains and a second input coupled to an output of the corresponding one of the sub-chains, with the given clock domain bypass multiplexer being further configured to selectively bypass its corresponding sub-chain responsive to the control value stored in its associated clock domain bypass register.

8. The integrated circuit of claim 4 wherein a given one of the clock domain bypass registers comprises a settable D-type flip-flop.

9. An integrated circuit comprising:
   scan test circuitry; and
   additional circuitry subject to testing utilizing the scan test circuitry;
   the scan test circuitry comprising at least one scan chain having a plurality of sub-chains associated with respective distinct clock domains;
   the scan test circuitry further comprising clock domain bypass circuitry configured to selectively bypass one or more of the sub-chains;
   wherein the scan chain is configurable in a scan shift mode of operation to form a serial shift register that includes fewer than all of the sub-chains with at least a remaining one of the sub-chains being bypassed by the clock domain bypass circuitry so as to not be part of the serial shift register in the scan shift mode;
   wherein the clock domain bypass circuitry comprises:
   a plurality of clock domain bypass multiplexers; and
   a plurality of clock domain bypass registers;
   wherein the clock domain bypass registers store respective control values for application to respective select lines of the clock domain bypass multiplexers; and
   wherein a given one of the clock domain bypass registers comprises a flip-flop having a data input coupled to a voltage potential, a data output coupled to the select line of a corresponding one of the clock domain bypass multiplexers, a set input coupled to a bypass signal line, and a clock input driven as a function of a clock signal of the associated clock domain and a scan enable signal.

10. The integrated circuit of claim 9 wherein the given clock domain bypass register further comprises at least one logic gate operative to generate a signal for application to the clock signal input of the flip-flop as a function of the clock signal of the associated clock domain and the scan enable signal.

11. The integrated circuit of claim 10 wherein the logic gate comprises an AND gate having a first input adapted to receive the clock signal of the associated clock domain, and a second input adapted to receive an inverted version of the scan enable signal, such that the signal generated by the logic gate for application to the clock input of the flip-flop corresponds to the clock signal of the associated clock domain gated by the inverted version of the scan enable signal.

12. The integrated circuit of claim 9 wherein the control value is stored in the given clock domain bypass register responsive to assertion of the bypass signal line in a capture phase of a given test pattern, and further wherein that register is subsequently reset in conjunction with application of each of a plurality of different test patterns to the scan chain.

13. The integrated circuit of claim 1 wherein the scan test circuitry further comprises:
a decompressor;
a compressor; and
a plurality of scan chains including said at least one scan chain, with the scan chains being arranged in parallel with one another between respective outputs of the decompressor and respective inputs of the compressor;
wherein scan test signals are applied to respective inputs of the decompressor;
wherein scan test input data from the decompressor is shifted into the scan chains for use in the scan testing; and
wherein scan test output data indicative of results of the scan testing is subsequently shifted out of the scan chains into the compressor.

14. A disk drive controller comprising the integrated circuit of claim 1.

15. A method comprising:
configuring at least one scan chain to include a plurality of sub-chains associated with respective distinct clock domains, wherein the plurality of sub-chains are connected in series with each other; and
bypassing at least one of the sub-chains in a scan shift mode of operation;
wherein a serial shift register formed using the scan chain in the scan shift mode of operation includes fewer than all of the sub-chains with any remaining ones of the sub-chains being bypassed so as to not be part of the serial shift register;
wherein the bypassing step further comprises bypassing one or more of the sub-chains determined to be inactive in a capture phase of a test pattern;
wherein a given sub-chain is determined to be inactive if its corresponding clock domain remains inactive during the capture phase.

16. The method of claim 15 wherein the bypassing step further comprises bypassing different ones of the sub-chains for different test patterns.

17. A computer program product comprising a non-transitory computer-readable storage medium having computer program code embodied therein for use in scan testing an integrated circuit, wherein the computer program code when executed in a testing system causes the testing system to perform the steps of the method of claim 15.

18. A processing system comprising:
a processor; and
a memory coupled to the processor and configured to store information characterizing an integrated circuit design;
wherein the processing system is configured to provide within the integrated circuit design scan test circuitry, the scan test circuitry comprising at least one scan chain having a plurality of sub-chains associated with respective distinct clock domains, wherein the plurality of sub-chains are connected in series with each other;
the scan test circuitry further comprising clock domain bypass circuitry configured to selectively bypass one or more of the sub-chains;
wherein the scan chain is configurable in a scan shift mode of operation to form a serial shift register that includes fewer than all of the sub-chains with at least a remaining one of the sub-chains being bypassed by the clock domain bypass circuitry so as to not be part of the serial shift register in the scan shift mode;
wherein the clock domain bypass circuitry is configured to bypass one or more of the sub-chains that are determined to be inactive in a capture phase of a particular test pattern; and
wherein a given sub-chain is determined to be inactive if its corresponding clock domain remains inactive during the capture phase.

* * * * *